Figure 1A:
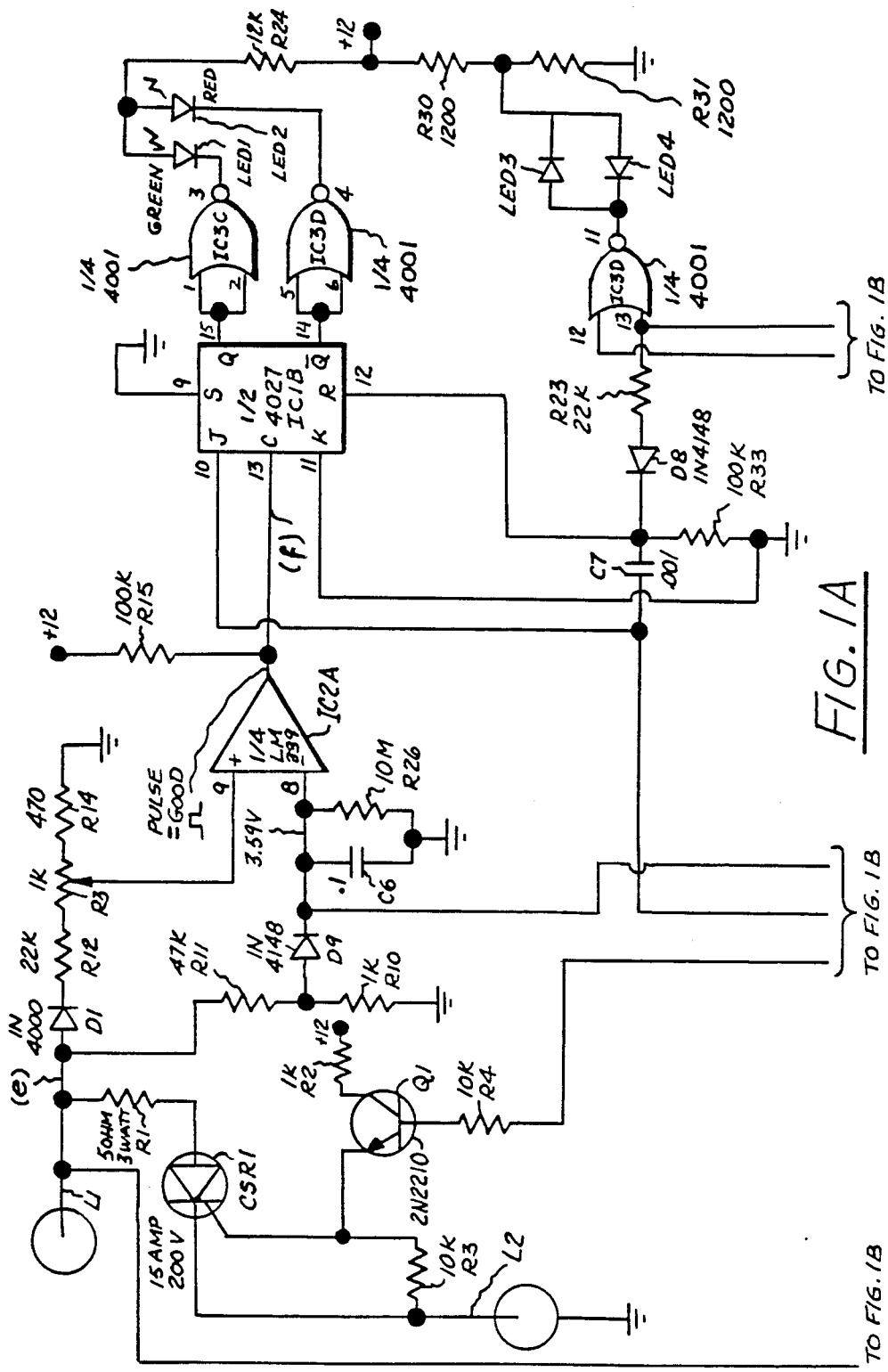

United States Patent [19]

Graham

[11] Patent Number: 4,857,826
[45] Date of Patent: Aug. 15, 1989

[54] TESTER SYSTEM FOR ELECTRICAL POWER CIRCUITS TERMINATED AT AN OUTLET PLUG RECEPTACLE

[75] Inventor: George A. Graham, Buffalo, N.Y.
[73] Assignee: Polytronics, Inc., Buffalo, N.Y.
[21] Appl. No.: 936,684
[22] Filed: Nov. 26, 1986
[51] Int. Cl.4 ............................................. G01R 31/02
[52] U.S. Cl. .................................... 324/508; 324/508; 324/509
[58] Field of Search ................. 324/508, 509, 51, 102, 324/485; 361/42–50, 93, 86–88; 323/300, 319, 299, 235, 243

[56] References Cited

U.S. PATENT DOCUMENTS

| | | | |
|---|---|---|---|
| 3,205,436 | 9/1965 | Donahue . | |
| 3,281,677 | 10/1966 | Baggott . | |
| 3,699,392 | 10/1972 | Lee et al. | 324/509 X |
| 3,723,854 | 3/1973 | Kita | 323/300 X |
| 3,810,003 | 5/1974 | Portoulas | 324/508 |
| 3,851,243 | 11/1974 | Banner | 324/508 |
| 3,869,664 | 3/1975 | Safer et al. | 324/509 X |
| 3,904,958 | 9/1975 | Gartland . | |
| 3,908,286 | 9/1975 | Dean et al. | 324/508 X |
| 3,952,244 | 4/1976 | Spear | 324/508 |
| 3,969,711 | 7/1976 | Ahntholz | 361/42 X |
| 4,039,897 | 8/1977 | Dragoset | 323/243 X |
| 4,041,380 | 8/1977 | Epstein | 324/508 X |
| 4,066,950 | 1/1978 | Rumold et al. | 324/509 X |
| 4,127,807 | 11/1978 | Peplow . | |
| 4,164,702 | 8/1979 | Pereda . | |
| 4,167,701 | 8/1979 | Gulledge et al. | 324/508 |
| 4,227,145 | 10/1980 | Bonikowski . | |
| 4,280,092 | 11/1981 | Wells . | |
| 4,292,585 | 9/1981 | Charette | 324/508 X |
| 4,340,852 | 7/1982 | Togneri | 324/509 X |
| 4,360,783 | 11/1982 | Nagasawa et al. | 323/243 X |
| 4,362,986 | 12/1982 | Burke . | |
| 4,426,614 | 1/1984 | Nola | 323/243 |
| 4,428,020 | 1/1984 | Blanchard . | |
| 4,574,276 | 3/1986 | Sato . | |
| 4,636,715 | 1/1987 | Borkowicz | 324/509 X |
| 4,688,133 | 8/1987 | Freeman | 361/45 |
| 4,689,548 | 8/1987 | Mechlenburg | 323/300 X |

Primary Examiner—M. H. Paschall
Assistant Examiner—A. Jonathan Wysocki
Attorney, Agent, or Firm—Joseph P. Gastel; Martin LuKacher

[57] ABSTRACT

A tester system which is adapted to be plugged into the outlet receptacle of an electrical power circuit for testing for faults which would affect the capability of the circuit to provide rated output voltage at rated load, whether the output line voltage is within a selected voltage range, and whether the receptable has been properly wired to the high voltage or hot conductor, the low voltage or return conductor and to the earth grounding wire. The tester is enabled on occurrence of a plurality of alternate cycles of the AC power carried by the circuit to connect the line conductors across a measuring resistor of sufficiently low value to draw rated current from the line. An electronic switch, including an SCR, is triggered coincident with the zero crossing of the AC cycle so that a single half-cycle of current passes through the measurement resistor. The measurement resistor may be rated much lower than the rated power. A resistor rated at three watts may be suitable. A comparison and indicating circuit operated synchronously with the trigger pulses compares the voltage across the measurement resistor with a reference voltage derived from the line conductors at no load condition before the measurement resistor is connected across the lines. A timing circuit inhibits the current measurement test components of the tester and enables the voltage range test after the plurality of AC cycles during which the current test is performed.

14 Claims, 3 Drawing Sheets

TESTER SYSTEM FOR ELECTRICAL POWER CIRCUITS TERMINATED AT AN OUTLET PLUG RECEPTACLE

DESCRIPTION

The present invention relates to electrical power circuit testing systems, and particularly to a system for testing an electrical power circuit at an outlet receptacle thereof to provide indications of circuit faults which can affect the capability of the circuit to provide rated current at rated voltage.

While the present invention is especially suitable for testing power circuits for their full load carrying capacity, it is adapted to perform other tests on the circuit, including whether the line voltage is within a certain voltage range, whether the wiring of the receptacle is proper, and whether the ground fault interrupter is operative by causing actuation thereof. The entire testing system may be provided in an integral device which may be plugged into the receptacle so as to automatically and without manual intervention conduct the full load carrying capacity, line voltage range and other tests.

Devices for conducting current carrying capacity tests on power circuits heretofore proposed (See U.S. Pat. Nos. 3,281,677 issued Oct. 25, 1966, 3,205,436 issued Sept. 7, 1965 and 4,227,145 issued Oct. 7, 1985) have the drawback of giving rise to possible catastrophic conditions because of transients and sparks which can possibly result when the high current tests are conducted. Testers heretofore proposed have the additional drawback of inaccuracies due to arbitrary settings which are invariant to power circuit conditions, such as varying power line voltages. Such testers can then give erroneous readings of safe operation because the line voltage is low at the time the test is made. In addition testers which have been available do not provide all of the test functions in an integral compact instrument. In addition to current carrying capacity, tests for power line voltage levels, wiring of the receptacle and ground faults have not been integrated in a single self-contained and easily used instrument.

It is the principal object of the present invention to provide an improved power circuit testing system wherein the foregoing drawbacks and disadvantages are obviated.

It is a further object of the invention to provide an improved power circuit tester capable of indicating whether or not faults or other defects in the power circuit are present by indicating whether or not the circuits have full load carrying capacity.

It is a still further object of the present invention to provide an improved power circuit tester system which does not give rise to unsafe conditions when operated.

Briefly described, a tester system embodying the invention provides for the automatic and safe testing of the capability of an AC electrical power circuit, terminated at an output plug receptacle, to operate at rated load current. This system includes means for deriving from the power circuits, as by being connected into the output plug, a reference voltage corresponding to the voltage at the outlet. Means are also provided for deriving from the power circuit a pulse of current at the rated load, which pulse commences sufficiently close to a zero crossover in the AC cycle of the current to avoid unsafe transients in the power circuit or other surges engendering unsafe conditions. The likelihood of sparks in the power circuits (behind walls) is therefore reduced. The tester also has means for comparing a voltage corresponding to the current pulse and a voltage corresponding to the reference voltage for providing an indication of the faults which could adversely affect the full load carrying capacity of the power circuit. Since the comparison is made with a reference voltage which depends upon the AC line voltage, erroneous readings due to low AC line voltage are avoided and accurate operation is achieved.

Figure 1B:
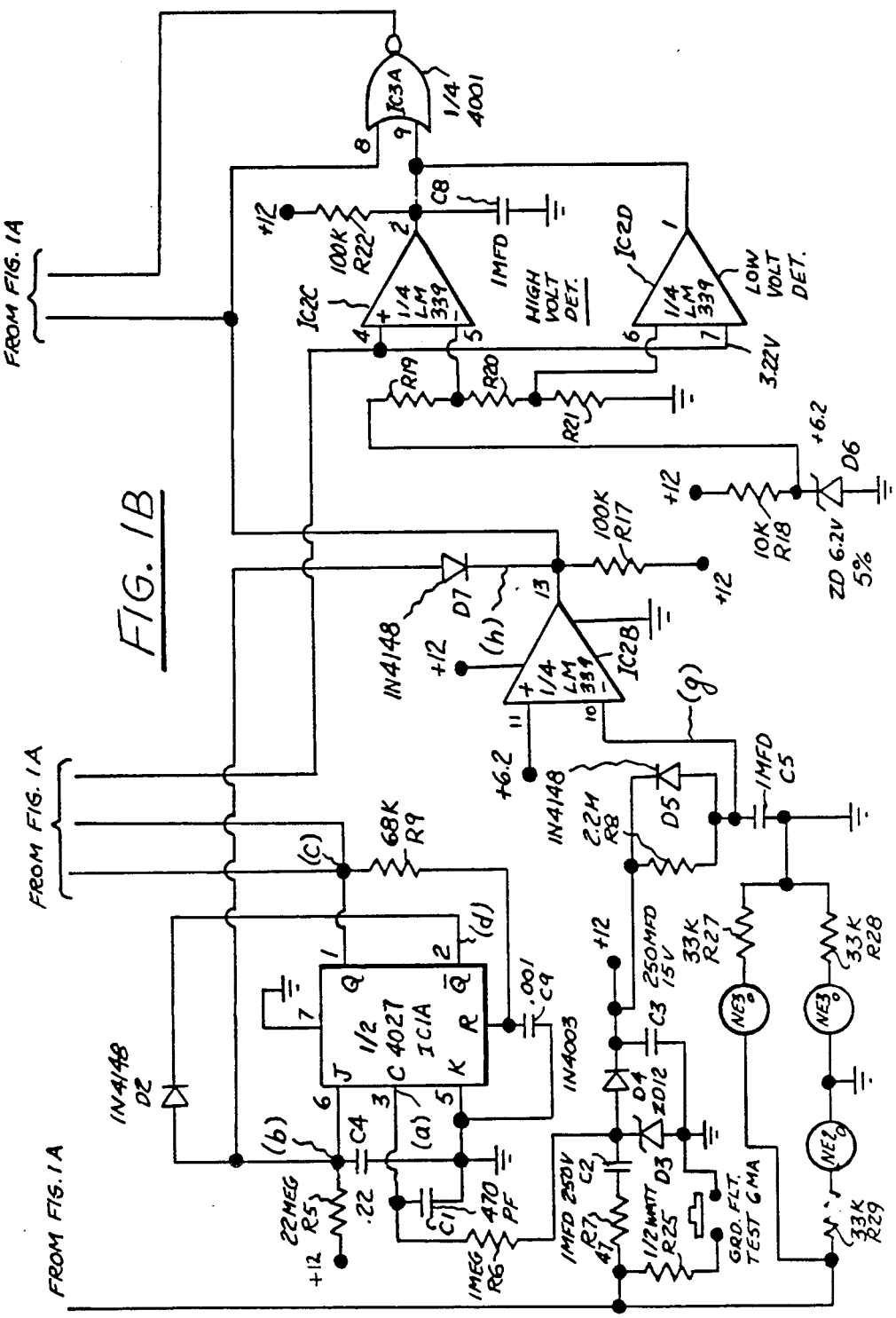
Figure 2:
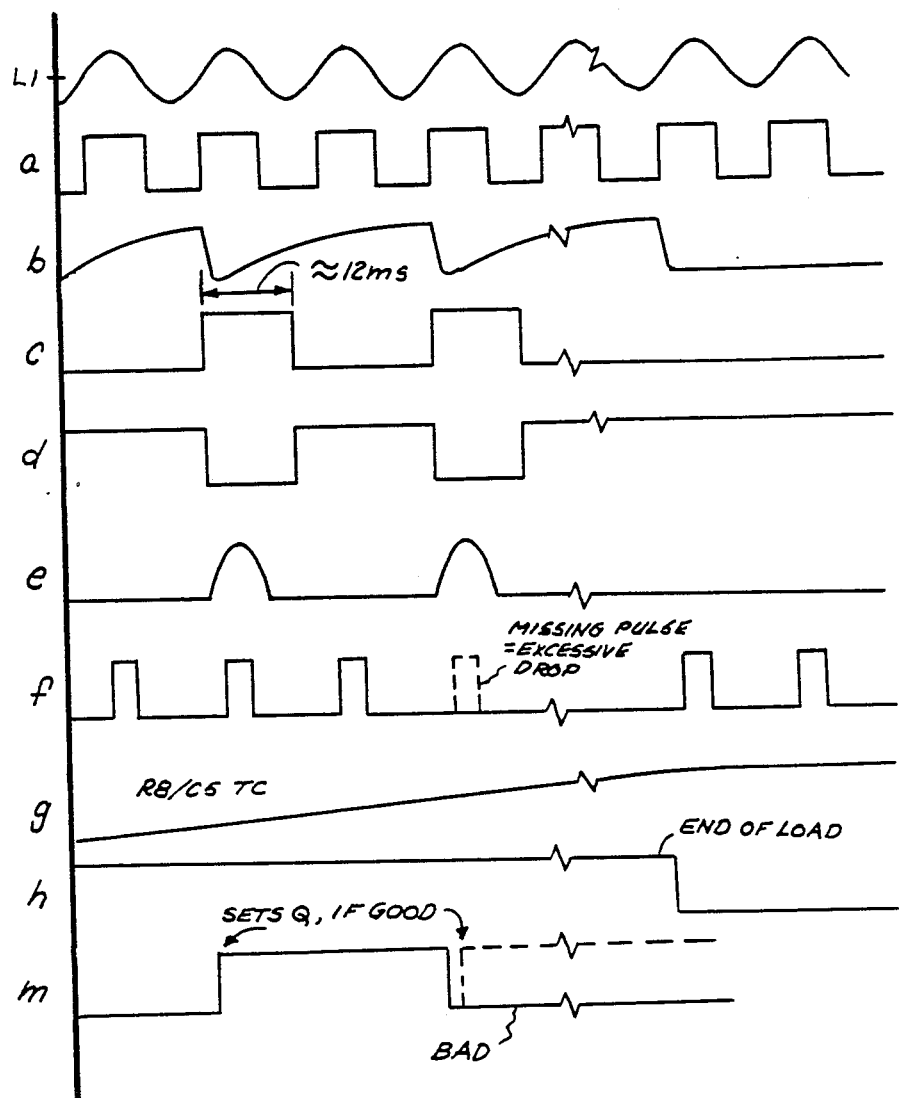

The foregoing and other objects features and advantages of the invention, as well as a presently preferred embodiment thereof, will be more apparent from the following detailed description and the accompanying drawings in which:

FIG. 1 shown in the drawing as FIG. 1A and FIG. 1B is a schematic diagram of a power tester system embodying the invention;

FIG. 2 is a series of waveforms of voltage at indicated points in the system of FIG. 1.

Referring to FIG. 1 there is shown a schematic diagram of embodiment of a tester system embodying the invention. The system is adapted to be housed in an integral device (an instrument) which may be plugged into a power circuit receptacle. The plug may be located at one end of the device. The plug is shown schematically by circles into which prongs serving as connectors L1 and L2 extend. In the case of three-wire systems a prong may be provided which is connected to earth ground. Earth ground is shown between two neon lamps NE2 and NE3 of a line-wiring tester which includes another neon lamp NE1. These lamps and other indicators indicated as light emitting devices LED1, 2, 3 and 4 extend from the instrument and are visible to the electrician or other operator.

The schematic diagram indicates by symbols, in accordance with accepted convention, the resistors, capacitors, transistors, silicon control rectifier (SCR) which is indicated as CSR1 in FIG. 1, JK flip flops type 4027, comparators type LM339 and NOR gates type 4001. Capacitance values are indicated in microfarads, unless otherwise indicated. Resistors are indicated in ohms, unless indicated by M or MEG to indicate megohms and K to indicate kilohms. The values of the components and the particular components are presented for purposes of illustration and to indicate the best mode now known for practicing the invention.

The voltage across the AC lines of the power circuit is applied to a power supply circuit including a voltage dropping capacitor C2 (forming a voltage divider with D3), a filter capacitor C3, a rectifying diode D4, a zener diode (ZD) D3 and a protective resistor R7. The zener diode presents a square-wave voltage of duration equal to one-half cycle of the line voltage (See L1, FIG. 2). This square-wave voltage is delayed in its application to the clock (C) input of a JK flip flop, IC1A, by an RC delay circuit, C1 and R6. The waveforms in FIG. 2 represents steady state conditions.

If desired, a fuse may be inserted in the line from conductor L1. A switch may be inserted also in the line from conductor L1, which is depressed during testing operations; a push button switch being suitable.

During steady state operation, the voltage across a capacitor C4 of a charging circuit C4, R5 increases as C4 charges (See waveform (b)). The RC time constant extends through a plurality of cycles of the AC line voltage. Accordingly, when a positive going edge of the square wave (a) occurs, the flipflop IC1A is set and its Q output goes high. The flipflop IC1A is connected as a one-shot and is reset via R9 and C9 after somewhat less than a cycle of the AC line voltage (12 milliseconds being suitable as shown in waveform (c)). The not Q ($\overline{Q}$) output follows as shown in waveform (d). When the not Q output of the flipflop goes low, the capacitor C4, connected to the J input of the flipflop, discharges and the charging cycle commences again. By virtue of the charging cycle, only a limited number of trigger signals corresponding to the rising edge of the Q output (waveform (c)) are generated. The trigger signal turns on a switching transistor Q1 which applies the trigger pulse to the control electrode of the SCR (SR 1). A pulse of current then flows through a 3-watt, 5-ohm measurement resistor R1 and the SCR to ground (at the ground conductor L2). It will be apparent from waveform (e) that the current pulse commences at the zero crossover of the AC line voltage and, of course, the AC line current. The transients and surges which could possibly cause failures and sparks in the power circuit wiring (inside the wall and behind the receptacle) are avoided. The timing of the measurement current pulse is an important feature of the invention.

Another important feature of the invention is that a low wattage, small value resistor is used. Since the current flows in pulses during half-cycles of the AC current which are spaced a plurality of cycles apart, the power consumption is low and a low value, low power dissipation measuring resistor may be used. This resistor may be a wire-wound resistor, which in the event of an unexpected line surge or timing errors in the circuit, will quickly open circuit (much like a fuse) and avoid any possible damage to the tester or in the power line circuit itself. The low resistance value assures that the full load current is drawn through the measurement resistor R1 during the pulse when the SCR is triggered. This may be 15 amps as indicated in FIG. 1.

The current is measured by comparison of a voltage resulting from the current through the measurement resistor which is developed across a diode D1 and resistors R12, R3 and R14. R3 is a potentiometer and the measurement voltage is taken from the tap thereof. The no load voltage is measured by a resistive divider consisting of resistors R11 and R10 and a sample and hold or peak detector circuit including a diode D9 and a holding capacitor C6 with its high value (10 megohm) shunt resistor.

The comparator IC2A provides an output pulse, indicated at (f) in FIG. 2, when the load current is at full rated capacity (15 amps in this example). A comparison test is used. Accordingly, if the line voltage decreases resulting in a lower full load current the reference voltage to the comparator derived by the sample or hold, peak detector circuit will vary to compensate for the variation in line voltage.

The measurement circuit includes two LEDs, LED1 and LED2. One of which is green to indicate that the power circuit has at full load current carrying capacity. The other LED may be red. These LEDs will be energized with current which flows only when the output of the NOR gates connected thereto goes low. This occurs when the Q output of the latch flipflop IC1B goes high. Then the green LED1 will be illuminated. When Q of IC1B goes high, the red LED2 will be illuminated. At the beginning of the measurement time, corresponding with the leading edge of the output from Q of IC1A and therefore in synchronism with the trigger signal, flipflop IC1B is reset via a differentiator consisting of C7 and R33. If the output of comparator IC2A is not present to clock IC1B, IC1B remains reset and the red LED is illuminated via pin 14 IC1B and NOR gate 4001 pin 4, indicating excessive voltage drop in the line during the test. When the pulse at the output of IC2A is present (See FIG. 2(f)) which can occur only in synchronism with the trigger signal on the positive zero crossings of the AC power (See FIG. 2(a), when the J K inputs of flip-flop IC1B become high, IC1B is clocked, the Q output of IC1B goes high and the green LED is illuminated through the NOR gate IC3C. If the pulse indicating a good test does not occur, the flip flop IC1B is reset by the output of IC1A (FIG. 2(C)) via the differentiator C7, R33 as described above. The system is fail safe, since it will be reset (red LED2 lights) in the case of no output from the measurement circuit which is connected to and includes IC2A.

The load test continues on during a time constant set by C5 and R8 as shown in waveform (g). After the load current test, when the capacitor C5 charges above a reference input (6.2 volts) to the comparator IC2B, the output of the comparator goes low, which inhibits the setting of the control flipflop IC1A. Trigger pulses are no longer generated and the current test is not reinitiated until the circuit to L1 is broken and reclosed as by either pulling out and inserting the plug or with the switch in the line, if used.

A voltage range test circuit is provided to determine that the no load voltage is in a selected range between a high voltage and a low voltage as set by a reference voltage circuit including R18, D6, R19, R20 and R21. These reference voltages are applied into the inverting and direct input of a high voltage detector-comparator IC2C and a low voltage detector-comparator IC2D. The no load voltage will cause these comparators to provide a high output level when either above or below the high or low voltage limits. Then a NOR gate IC3A provides a high level which is inverted in the NOR gate IC3D so as to cause LED4 to light indicating a failure of the voltage range test. Otherwise, LED3, which may be green, will light and stay lit during the voltage test. If the voltage test shows that the line voltage is out of acceptable range, IC3A goes high and reset voltage is applied to IC1B's reset terminal via diode D8. This will cause LED2 to light and prevent operator confusion.

In order to test the ground fault interrupter, a ground fault switch SW1 is depressed. This is a pushbutton switch which provides a leakage current path through R25 sufficient to cause the ground fault interrupter in the power circuit, if the power circuit is so equipped, to operate. Verification of the ground fault can therefore readily be made with the same instrument that performs the load current capacity test and the voltage range test.

The neon lamps NE1, NE2 and NE3 are wired across the conductors connected to high, low and earth ground in a balance delta configuration using the balancing resistors R27, R28 and R29. Errors in the wiring of the receptacle are indicated by the sequence in which the neon lamps are lit.

From the foregoing description it will be apparent that there has been provided an improved tester system for electrical power circuits. A presently preferred embodiment is illustrated. Variations and modifications in that embodiment within the scope of the invention will undoubtedly suggest themselves to those skilled in the art. For example, a single set of indicator lamps (LEDs) may be used instead of two sets by multiplexing the outputs from the load current test and the voltage range test components. Other variations and modifications will undoubtedly suggest themselves to those skilled in the art. Accordingly, the foregoing description should be taken as illustrative and not in a limiting sense.

I claim:

1. A tester system which automatically and safely tests the capacity of an electrical power circuit having AC liners, which lines are terminated at an outlet to operate at rated load current when said system is connected to said electrical power circuit at said outlet, said system comprising means for deriving from said electrical power circuit a reference voltage corresponding to the AC line voltage at said outlet, means for deriving from said electrical power circuit a pulse of current at the rated load of said circuit which pulse commences sufficiently close to the zero crossover in the AC cycle to avoid unsafe transients in said electrical power circuit, and means for comparing a voltage corresponding to said pulse and said reference voltage for providing an indication of said capacity.

2. The tester system according to claim 1 further comprising means responsive to said reference voltage for providing an output indicative of level of said voltage provided by said electrical circuit across said lines at said outlet, and means for enabling only one of said voltage level indicating means and said pulse deriving means at the same time.

3. The tester system according to claim 2 further comprising means also connected to said electrical power circuit for performing a line fault test.

4. The tester system according to claim 2 further comprising three light emitting devices arranged in a balanced delta circuit and connected for indicating which of the conductors of said outlet is at high voltage in said electrical power circuit, at ground and connected to earth ground.

5. The tester system according to claim 1 wherein said rated current pulse deriving means comprises a resistor of resistance value sufficient to enable the flow of said rated current when connected across said power circuit lines, said resistor having a power rating much lower than the power drawn by said power circuit at rated AC current and rated AC line voltage, means responsive to said line voltage for generating a trigger pulse upon occurrence of zero crossover of each of said AC cycles, and electronic switch means operable by said trigger pulse and connected in series with said resistor across AC lines of said electrical power circuit.

6. The system according to claim 5 for the comprising means for inhibiting said trigger pulse generating means after a plurality of said AC cycles.

7. The tester system according to claim 6 wherein said comparing means includes means operative to latch said indication when said trigger pulse generating means is inhibited.

8. The tester system according to claim 5 further comprising means synchronizing the operation of said comparison and indication means with said trigger pulse producing means.

9. The tester system according to claim 5 wherein said switch is an SCR having an anode, a cathode and the trigger electrode, said anode and cathode being connected in series relationship with said resistor across the AC lines, and means for applying said trigger pulses to said trigger electrode.

10. The tester system to claim 5 including connector means adapted to said outlet and be connected to the AC power lines.

11. The system according to claim 5 further comprising means responsive to said trigger pulse for generating an output when said rated current flows through said resistor, indicator means having first and second channels for providing a good indication when said output pulse occurs in synchronism with said trigger signal and a bad indication when said output pulse does not occur in synchronism with said input signal.

12. The system according to claim 11, wherein said output pulse providing means comprises comparator means for comparing a voltage corresponding to the current flow through said resistor and said reference voltage.

13. The system according to claim 11 wherein said indicator means comprises first and second light emitting devices in said first and second channels, and logic means operated by said output pulse and said trigger signal for causing current flow through only one of said devices at the same time.

14. The system according to claim 13 further comprising means for actuating said second channel and providing current flow through said second device when said trigger signal occurs in the absence of said output pulse.

* * * * *

UNITED STATES PATENT AND TRADEMARK OFFICE
CERTIFICATE OF CORRECTION

PATENT NO. : 4,857,826
DATED : August 15, 1989
INVENTOR(S) : George A. Graham

It is certified that error appears in the above-identified patent and that said Letters Patent is hereby corrected as shown below:

Column 5, line 10 (claim 1), change "liners" to --lines--.

Column 5, line 26 (claim 2), after "electrical" insert --power--.

Column 6, line 20 (claim 10), after "system" insert --according--;

Column 6, line 21 (claim 10), after "to" (first occurrence) insert --plug into--.

Signed and Sealed this

Fifth Day of June, 1990

Attest:

HARRY F. MANBECK, JR.

*Attesting Officer*  *Commissioner of Patents and Trademarks*

UNITED STATES PATENT AND TRADEMARK OFFICE
Certificate

Patent No. 4,857,826                                                              Patented: August 15, 1989

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Harold P. Kopp, 5192 Eastbrooke Place, Williamsville, NY; Donald W. Davis, 31 Lowell Avenue, Tonawanda, NY; and George Graham, 815 Riverview Boulevard, Tonawanda, NY.

Signed and Sealed this Thirty-First Day of October, 2000.

ROBERT NAPPI
*Supervisory Patent Examiner*
Art Unit 2837

UNITED STATES PATENT AND TRADEMARK OFFICE
Certificate

Patent No. 4,857,826　　　　　　　　　　　　　　　　　Patented: August 15, 1989

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Harold P. Kopp, 5192 Eastbrooke Place, Williamsville, NY; Donald W. Davis, 31 Lowell Avenue, Tonawanda, NY; and George Graham, 815 Riverview Boulevard, Tonawanda, NY.

Signed and Sealed this Twenty-First Day of November, 2000.

ROBERT NAPPI
*Supervisory Patent Examiner*
Art Unit 2837